United States Patent
Tung

[11] Patent Number: 6,156,603
[45] Date of Patent: Dec. 5, 2000

[54] MANUFACTURING METHOD FOR REDUCING THE THICKNESS OF A DIELECTRIC LAYER

[75] Inventor: Ming-Tsung Tung, Hsinchu Hsien, Taiwan

[73] Assignee: United Mircroelectronics Corp., Hsinchu, Taiwan

[21] Appl. No.: 09/203,020

[22] Filed: Dec. 1, 1998

[51] Int. Cl.[7] .................................. H01L 21/70
[52] U.S. Cl. ..................... 438/239; 438/488; 438/532; 438/770; 438/787; 438/250; 438/253; 438/393; 438/396
[58] Field of Search ................... 438/239, 488, 438/495, 506, 508, 532, 770, 773, 787, 252, 253, 393, 396

[56] References Cited

U.S. PATENT DOCUMENTS

| | | | |
|---|---|---|---|
| 4,016,007 | 4/1977 | Wada et al. | 438/297 |
| 4,356,041 | 10/1982 | Kosa | 438/301 |
| 4,754,313 | 6/1988 | Takemae et al. | 257/306 |
| 5,470,764 | 11/1995 | Ikegami et al. | 438/362 |
| 5,624,871 | 4/1997 | Teo et al. | 438/453 |
| 5,814,542 | 9/1998 | Nakajima | 438/250 |

FOREIGN PATENT DOCUMENTS

| | | | |
|---|---|---|---|
| 6060768 | 4/1985 | Japan | 438/565 |
| 1295438 | 11/1989 | Japan | 438/297 |
| 2156562 | 6/1990 | Japan | 438/297 |

*Primary Examiner*—Mary Wilczewski
*Assistant Examiner*—Yung A. Lin
*Attorney, Agent, or Firm*—Hickman Coleman & Hughes, LLP

[57] ABSTRACT

The thickness of a capacitor dielectric layer is reduced by a manufacturing method. A first polysilicon layer is deposited on a substrate that has an isolation structure. Subsequently, nitrogen ions are implanted into the first polysilicon layer. The thickness of an oxide layer formed on the first polysilicon layer is determined by dosage of the implanted nitrogen ions. Next, the first polysilicon layer is patterned, so as to form a bottom electrode of the capacitor and expose a portion of the substrate. A thermal oxidation process is then performed to form an oxide layer, which is used as a gate oxide layer on the substrate and is also used as a dielectric layer in capacitor on the bottom electrode. Subsequently, a second polysilicon layer is deposited and patterned as an upper electrode of the capacitor on the capacitor dielectric layer. The thickness of the dielectric layer is affected by implanted nitrogen ions into the first polysilicon layer, so that the dielectric layer is thinner than the gate oxide layer. For this reason, the capacitance is increased, and simultaneously forming the gate oxide layer and the dielectric layer decreases the fabrication cycle time.

13 Claims, 3 Drawing Sheets

MANUFACTURING METHOD FOR REDUCING THE THICKNESS OF A DIELECTRIC LAYER

BACKGROUND OF THE INVENTION

1. Field of the Invention

The present invention relates to a manufacturing method for reducing the thickness of a dielectric layer. More particularly, the present invention relates to a manufacturing method for decreasing process time and reducing the thickness of a dielectric layer.

2. Description of the Related Art

FIGS. 1A through 1C are schematic, cross-sectional views showing the conventional manufacturing steps of MOS and capacitor. First, referring to FIG. 1A, a field oxide 102 is formed on a substrate 100 as a device isolation structure. A gate oxide layer 104 is then formed by thermal oxidation on the substrate 100, and the thickness of gate oxide layer 104 is about 100 angstroms to 200 angstroms. Next, a first polysilicon layer is deposited over the substrate 100. The first polysilicon layer is defined by photolithography and etching to form a gate 106 of a MOS on the gate oxide layer 104 and a bottom electrode 108 of a capacitor on the field oxide 102. Referring to FIG. 1B, an oxide layer 110 is formed by thermal oxidation on the gate 106 and on the bottom electrode 108. The oxide layer 110 is used as a capacitor dielectric layer. Referring to FIG. 1C, a second polysilicon layer is then deposited over the substrate 100 and defined by photolithography and etching to form an upper electrode 112 of the capacitor on the dielectric layer 110.

The conventional manufacturing method for forming the gate and the capacitor consumes a long cycle time of process to causes decreased efficiency and high cost, and it is difficult to use this method to form a thin dielectric layer to increase the capacitance.

SUMMARY OF THE INVENTION

Accordingly, it is an object of the invention to reduce the fabrication cycle time for forming a gate and a capacitor. The invention also increases the efficiency and lowers the cost of manufacturing devices.

It is another object of the invention to reduce the thickness of a dielectric layer in a capacitor, so that the capacitance is increased and a greater amount of charges is stored in capacitor.

To achieve these and other advantages and in accordance with the purpose of the invention, as embodied and broadly described herein, the invention provides a manufacturing method for reducing the thickness of a capacitor dielectric layer. A substrate that has an isolation structure is provided, and a first polysilicon layer is formed on the substrate. Nitrogen ions are implanted into the first polysilicon layer, and thereby the thickness of an oxide layer formed on the first polysilicon layer is determined by dosage of the implanted nitrogen ions. The first polysilicon layer is patterned to form a bottom electrode of the capacitor and to expose a portion of the substrate. A thermal oxidation process is performed for forming an oxide layer, which is used as a gate oxide layer on the substrate and it is also used as a capacitor dielectric layer on the bottom electrode. A second polysilicon layer is deposited and patterned as an upper electrode on the capacitor dielectric layer of the capacitor. Furthermore, while the second polysilicon layer is patterned to form the upper electrode, by transferring a pattern of both a gate and a upper electrode, a gate can also be formed on the gate oxide layer by the same step for forming the upper electrode. The thickness of the dielectric layer is affected by nitrogen ions implanted into the first polysilicon layer, so that the dielectric layer is thinner than the gate oxide layer. For this reason, the capacitance is increased, and simultaneously forming the gate oxide layer and the dielectric layer decreases the fabrication cycle time.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
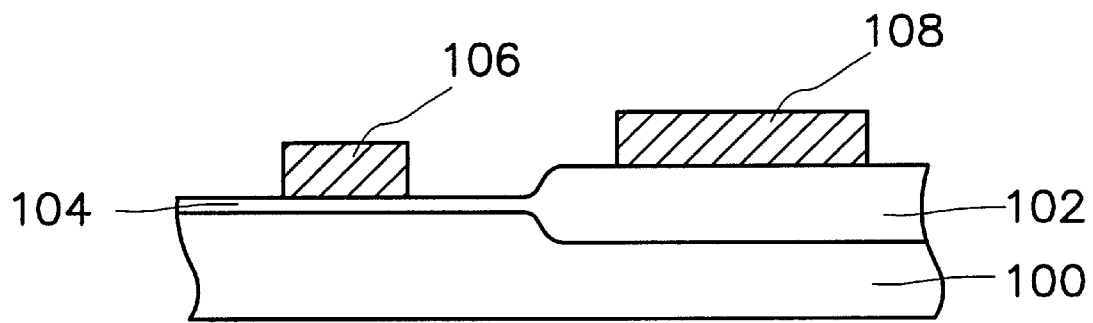
FIGS. 1A through 1C are schematic, cross-sectional views showing the progression of the conventional manufacturing steps for a gate of a MOS device and capacitor.
Figure 1B:
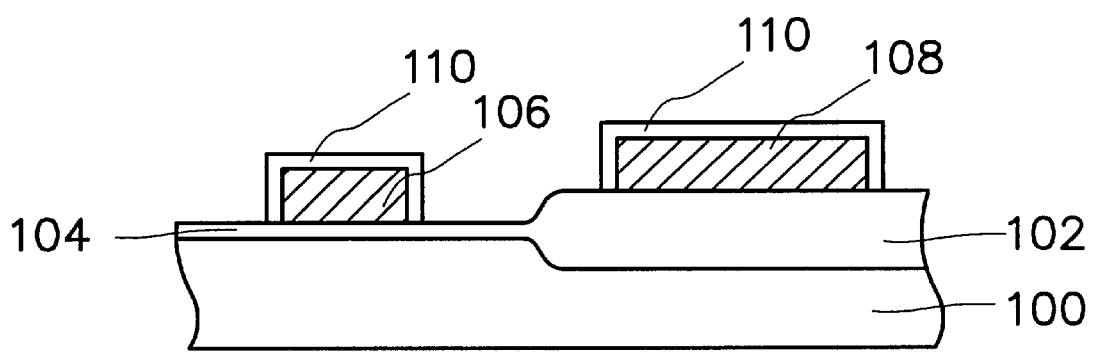
Figure 1C:
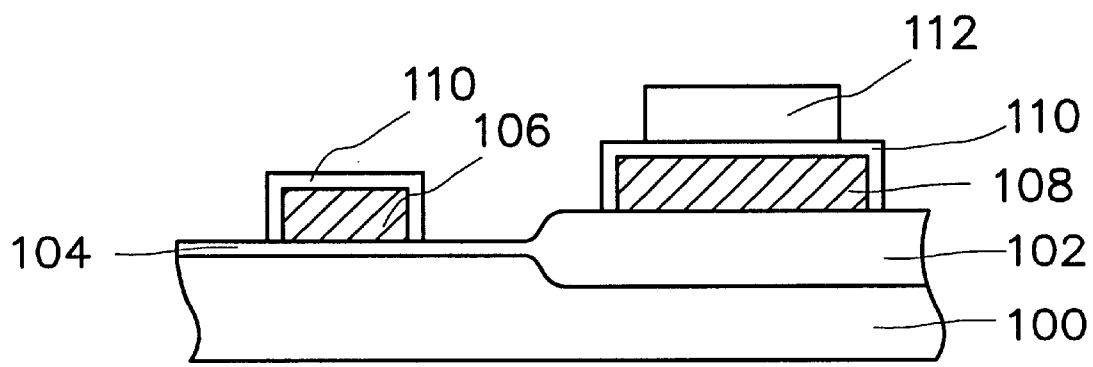

Reference will now be made in detail to the present preferred embodiments of the invention, examples of which are illustrated in the accompanying drawings. Wherever possible, the same reference numbers are used in the drawings and the description to refer to the same or like parts.

The conventional manufacturing steps for a gate of the MOS device and the capacitor include first forming a gate oxide layer, and then forming a gate and a bottom electrode of the capacitor. Thereafter, a dielectric layer and an upper electrode of the capacitor are formed. These steps consume much time and are unable to produce a thin dielectric layer. The invention provides a manufacturing method for a MOS gate and a capacitor not only to decrease the process time, but also to control the thickness of the capacitor dielectric layer as thin as required.

Figure 2A:
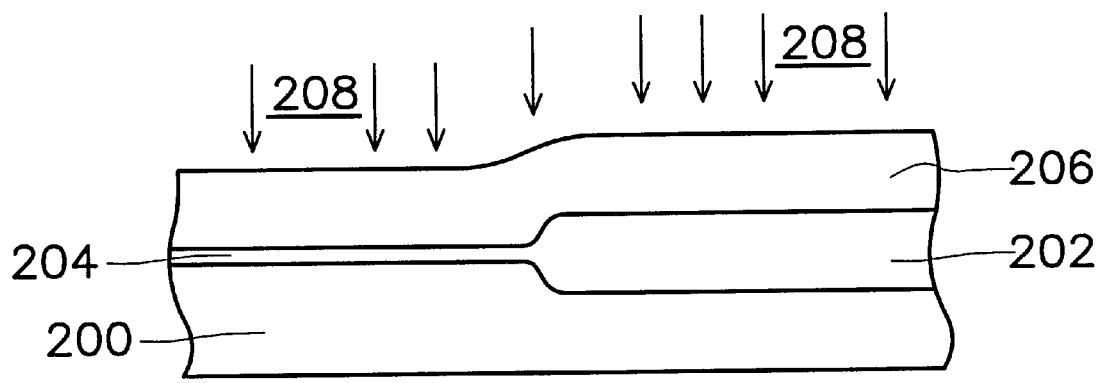
FIGS. 2A through 2D are schematic, cross-sectional views showing the progression of manufacturing steps for a gate of a MOS and capacitor in accordance with the preferred embodiment of the present invention.

Referring to FIG. 2A, a substrate 200 is provided. Preferably, the substrate 200 comprises an isolation structure such as a field oxide layer 202, a sacrifical oxide layer 204 is formed by, for example, thermal oxidation on the substrate 200. A first polysilicon layer 206 is deposited by, for example, chemical vapor deposition over the substrate 200. Impurities are implanted into the first polysilicon layer 206 to increase the conductivity. Preferably, the impurities include ions 208 such as nitrogen ions. The ions are implanted to the substrate 200 globally. This step of ion implantation can control a thickness of an oxide layer formed thereafter. The mechanism is to be introduced in the following paragraph.

Figure 2B:
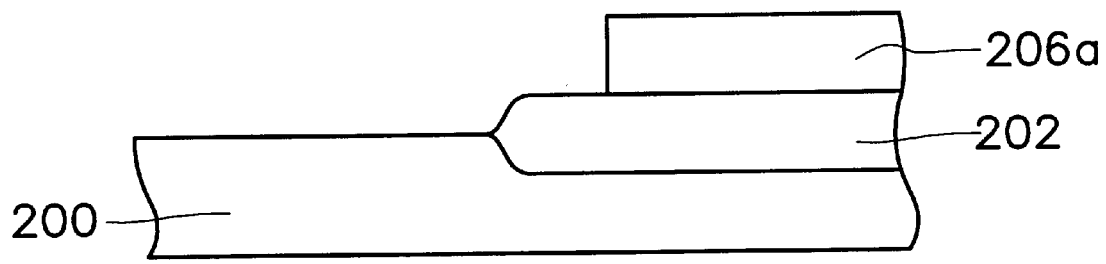

As shown in FIG. 2B, the first polysilicon layer 206 is defined to form a bottom electrode 206a of the capacitor over the substrate 200, preferably, on the field oxide 202 in this embodiment. The sacrificial oxide layer 204 is removed from the substrate 200 to expose the substrate 200.

Figure 2C:
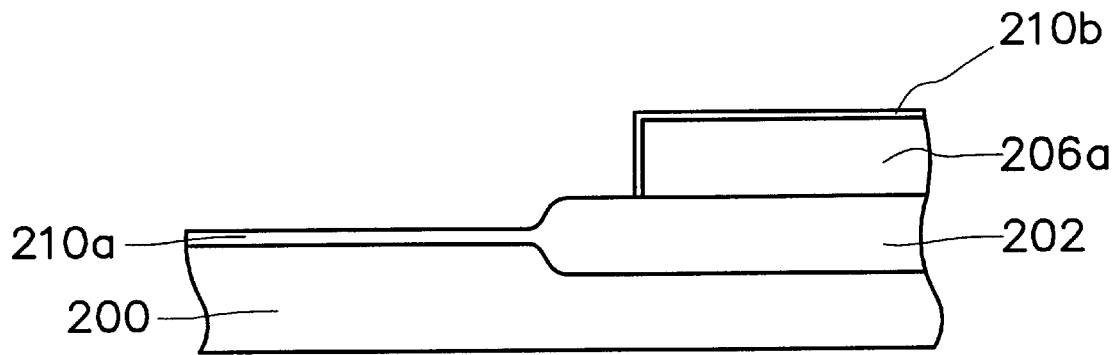

As shown in FIG. 2C, a thermal oxidation step is performed to simultaneously form an oxide layer 210a as a gate oxide layer of the MOS device on the exposed substrate 200 and an oxide layer 210b as a capacitor dielectric layer to cover the bottom electrode 206a.

Typically, the first polysilicon layer 206 has a lattice structure that comprises vacancies. Being implanted by the ions 208 as shown in FIG. 2A, a portion of these vacancies are occupied by the ions 208. Therefore, the formation of silicon oxide is inhibited. As a result, the oxide layer 210b formed on the first polysilicon layer 206a is thinner than the oxide layer 210a formed on the substrate 200. The more ions 208 are implanted, the more vacancies are occupied by the ions 208, so that the thickness of the oxide layer 210b is thinner. To achieve the object of forming a thin oxide layer by the inhibition effect mentioned above, nitrogen ions are preferably used. The inhibition effect is controlled by dosage of the implanted ions. When the reactant, that is, the first polysilicon layer 206a is decreased because the vacancies thereof are occupied by the implanted ions 208, the yield of the product is limited. This results in reducing the thickness of the oxide layer 210b formed on the first polysilicon layer 206a, and thus the thickness of the oxide layer 210b used as a dielectric layer is thin, which in turn increases the capacitance. In contrast, the exposed substrate 200 is not doped or implanted with ions 208, so that the oxide layer 210a formed on the exposed substrate 200 is thicker than the oxide layer 210b formed on the first polysilicon layer 206a. In the invention, the thinner oxide layer 210b and the thicker oxide layer 210a are formed simultaneously in only one thermal oxidation step.

Figure 2D:
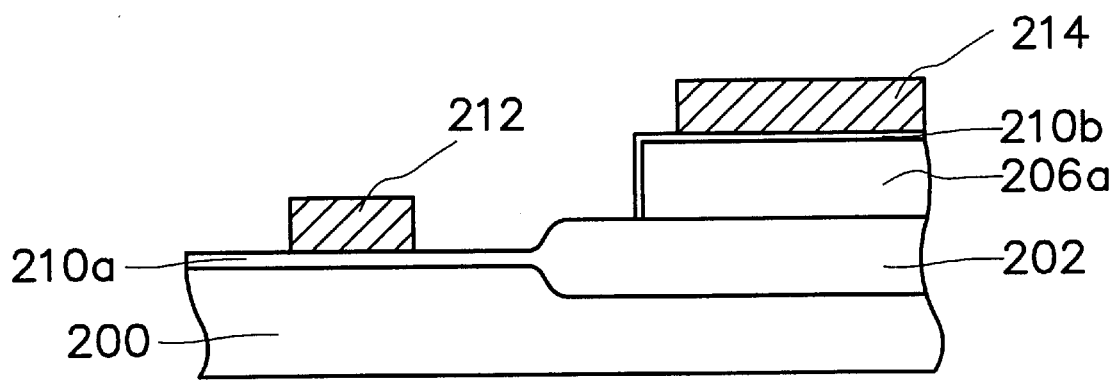

As shown in FIG. 2D, a second polysilicon layer is formed over the substrate 200. The second polysilicon layer is defined by a photolithography and etching process to form a gate 212 on the gate oxide layer 210a and an upper electrode 214 on the dielectric layer 210b of the capacitor. The gate of the MOS and the capacitor structures are thus formed.

In this invention, an ion implantation step is performed to the first polysilicon layer. The purpose of this step is to decrease the growth rate of silicon oxide on the first polysilicon layer, and the growth rate of the silicon oxide depends on the dosage of the implanted ions. A thin oxide layer is formed as a dielectric layer on the first polysilicon layer in a capacitor while forming a thicker gate oxide layer of the MOS. Moreover, the gate oxide layer and the dielectric layer are formed simultaneously in this invention to reduce the required process time. The gate of the MOS device and the bottom electrode of the capacitor are formed by defining the second polysilicon layer in a same step. The ion implantation step is used to reduce the thickness of the dielectric layer and improves the capacitance of the capacitor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method for reducing the thickness of a dielectric layer, comprising the steps of:

providing a substrate having an isolation structure;

forming a first polysilicon layer over the substrate;

implanting nitrogen ions into the first polysilicon layer;

patterning the first polysilicon layer, so as to form a bottom electrode on the isolation structure and to expose a part of the substrate;

forming a first oxide layer on the first polysilicon layer and a second oxide layer on the exposed substrate simultaneously;

forming a second polysilicon layer over the substrate; and patterning the second polysilicon layer, so as to form a gate on the second oxide layer and an upper electrode on the first oxide layer, the first oxide layer forming the dielectric layer.

2. The method of claim 1, wherein the first oxide layer is used as a dielectric layer.

3. The method of claim 1, wherein the second oxide layer is used as a gate oxide layer.

4. The method of claim 1, wherein the dielectric layer is thinner than the gate oxide layer.

5. The method of claim 4, wherein the dielectric layer has a thickness determined by dosage of the implanted nitrogen ions.

6. A manufacturing method for forming a semiconductor device, comprising steps of:

providing a substrate;

forming a first polysilicon layer over the substrate;

implanting ions into the first polysilicon layer;

patterning the polysilicon layer, so as to form a bottom electrode and to expose a part of the substrate;

oxidizing the exposed substrate and the bottom electrode; and forming a gate on the oxidized substrate and an upper electrode on the oxidized polysilicon layer simultaneously.

7. The method of claim 6, further comprising a step of forming a sacrificial oxide layer on the substrate before the step of forming the first polysilicon layer on the substrate.

8. The method of claim 6, further comprising a step of removing the sacrificial oxide layer after the step of patterning the first polysilicon layer.

9. The method of claim 6, wherein the ions include nitrogen ions.

10. The method of claim 6, wherein the step of oxidizing the exposed substrate and the bottom electrode includes using thermal oxidation method.

11. The method of claim 6, wherein after the step of oxidizing the exposed substrate and the bottom electrode, a dielectric layer and a gate oxide layer are formed.

12. The method of claim 11, wherein the dielectric layer is thinner than the gate oxide layer.

13. The method of claim 12, wherein the thickness of the dielectric layer is determined by dosage of the implanted ions.

* * * * *